(12) United States Patent
Yu et al.

(10) Patent No.: US 9,618,342 B2
(45) Date of Patent: Apr. 11, 2017

(54) MEMS ANTI-PHASE VIBRATORY GYROSCOPE

(71) Applicant: Chinese Academy of Sciences Institute of Geology and Geophysics, Beijing (CN)

(72) Inventors: Lian Zhong Yu, Beijing (CN); Chen Sun, Beijing (CN)

(73) Assignee: Chinese Academy of Sciences Institute of Geology and Geophysics, Beijing (CN)

( * ) Notice: Subject to any disclaimer, the term of this patent is extended or adjusted under 35 U.S.C. 154(b) by 401 days.

(21) Appl. No.: 14/270,596

(22) Filed: May 6, 2014

(65) Prior Publication Data

US 2016/0238390 A1  Aug. 18, 2016

(30) Foreign Application Priority Data

Jun. 5, 2013 (CN) .......................... 2013 1 0221698

(51) Int. Cl.
*G01C 19/5747* (2012.01)
*G01C 19/5769* (2012.01)

(52) U.S. Cl.
CPC ..... *G01C 19/5747* (2013.01); *G01C 19/5769* (2013.01)

(58) Field of Classification Search
CPC ..... G01P 15/08; G01P 15/125; G01C 19/574; G01C 19/5747; G01C 19/5769
USPC ......................................... 73/504.02, 504.14
See application file for complete search history.

(56) References Cited

U.S. PATENT DOCUMENTS

| | | | | |
|---|---|---|---|---|
| 5,712,426 A | * | 1/1998 | Sapuppo ................ | G01C 19/42 73/504.02 |
| 6,481,283 B1 | * | 11/2002 | Cardarelli .......... | G01C 19/5719 73/504.02 |
| 8,336,380 B2 | * | 12/2012 | Kandori ............. | G01C 19/5712 73/504.12 |
| 2013/0340522 A1 | * | 12/2013 | Kuhlmann ......... | G01C 19/5747 73/504.12 |

FOREIGN PATENT DOCUMENTS

| | | |
|---|---|---|
| CN | 101135559 | 3/2008 |
| CN | 101180516 | 5/2008 |

* cited by examiner

*Primary Examiner* — Laura Martin
*Assistant Examiner* — Irving A Campbell
(74) *Attorney, Agent, or Firm* — Dergosits & Noah LLP

(57) ABSTRACT

A MEMS anti-phase vibratory gyroscope includes two measurement masses with a top cap and a bottom cap each coupled with a respective measurement mass. The measurement masses are oppositely coupled with each other in the vertical direction. Each measurement mass includes an outer frame, an inner frame located within the outer frame, and a mass located within the inner frame. The two measurement masses are coupled with each other through the outer frame. The inner frame is coupled with the outer frame by a plurality of first elastic beams. The mass is coupled with the inner frame by a plurality of second elastic beams. A comb coupling structure is provided along opposite sides of the outer frame and the inner frame. The two masses vibrate toward the opposite direction, and the comb coupling structure measures the angular velocity of rotation.

12 Claims, 10 Drawing Sheets

MEMS ANTI-PHASE VIBRATORY GYROSCOPE

CROSS-REFERENCE

This application claims priority from Chinese Patent Application No. 201310221698.5, filed May 6, 2013 and entitled A MEMS Anti-Phase Vibratory Gyroscope.

TECHNICAL FIELD

This invention relates to a sensor, and in particular, to a gyroscope.

BACKGROUND

Accelerometers are used in various applications, such as measuring the magnitude of an earthquake and gathering seismic data, detecting the magnitude of a collision during a car accident, and detecting the tilting direction and angle of a mobile phone or a game console. As micro-electro-mechanical systems (MEMS) technology continues to progress, nano-scale accelerometers have been widely used in commercial applications.

A gyroscope is able to detect the tilting direction and angle of an object, and has been used in many fields, such as ships and airplanes. As the micro-electro-mechanical systems (MEMS) technology continues to progress, many nano-scale gyroscopes have been widely used in commercial applications, such as automobiles, robots, cellphones, mobile devices, etc.

In contrast to traditional gyroscopes, a MEMS gyroscope does not contain any rotating parts or any bearings. Instead, a MEMS gyroscope uses a vibrating object to sense the angular velocity, and uses vibration to induce and detect the Coriolis force. For example, Chinese Patent Publication No. CN101180516 describes the use of a driver to drive multiple masses in the X direction. When the gyroscope rotates on the Z axis with angular velocity the mass will induce a Coriolis force $F_{cori}$ on the Y axis based on the equation listed below, and the gyroscope calculates the angular velocity $\Omega$ by measuring the Coriolis force in the Y direction: $F_{cori}=2 m\Omega v$; where m stands for mass, and v stands for velocity.

In order to increase the angular velocity $\Omega$ detecting sensitivity, a MEMS gyroscope needs to induce larger Coriolis force during detection. This can be achieved by increasing the mass m of the measurement mass or increasing the driving velocity v of the measurement mass. Most prior patents increase the detecting sensitivity of a gyroscope by increasing the mass m of the measurement mass. For example, Chinese Patent Publication No. CN101135559 increases the overall mass m of the measurement mass by providing multiple measurement masses. During measurement, a larger Coriolis force is generated, thus increasing the sensitivity of the gyroscope. However, providing multiple measurement masses on the same plane increases the chip size. Also, in a multiple-mass system, it is hard to keep the size of each measurement mass uniform. Therefore, energy is lost due to coupling, which decreases the sensitivity and induces noises. Furthermore, the range of motion between two masses is different.

In this disclosure, a solution is provided where two masses are connected with elastic beams to achieve a uniform displacement. However, during the manufacturing process, an offset may be generated to the elastic beam size, which limits the detection sensitivity. A structure having two masses also requires two electrical sensing circuits, which increases the circuit complexity and the energy consumption.

SUMMARY

The object of the present invention is to overcome the shortages of the existing gyroscopes, and to provide a gyroscope which has high sensitivity, low percentage of error, and high stability.

A MEMS anti-phase vibratory gyroscope includes a plurality of measurement masses, and a top cap and a bottom cap both coupled with the measurement masses. Two measurement masses are oppositely coupled with each other in the vertical direction. Each measurement mass includes an outer frame, an inner frame located within the outer frame, and a mass located within the inner frame. The two measurement masses are coupled with each other through the outer frame. The inner frame is coupled with the outer frame by a plurality of first elastic beams. The mass is coupled with the inner frame by a plurality of second elastic beams. A comb coupling structure is provided along opposite sides of the outer frame and the inner frame. The two masses vibrate toward the opposite vertical direction, and the comb coupling structure measures the angular velocity of rotation.

The first elastic beams are provided between the inner frame and the outer frame; and are symmetrically provided with respect to the midline of the mass. A gap space is formed between the inner frame and the outer frame, and the first elastic beams are provided within the gap space and can move freely within the gap space. The first elastic beams are U-shape folded beams.

The second elastic beams are provided between the mass and the inner frame. Each second elastic beam includes two elastic beams with a Y-shape, each Y-shape elastic beam having one main body part and two branch parts. The two branch parts are coupled respectively with the inner frame and the mass. The end portions of the main body parts of the two Y-shape elastic beams are provided at the corner of the inner frame, and the two end portions are connected to each other at a right angle. The thickness of the first elastic beam is larger than the thickness of the second elastic beam.

The measurement mass has a silicon on insulator structure, which includes a top silicon layer and a bottom silicon layer, with a buried oxide layer provided between two silicon layers. An epilayer is formed on the surface of the top silicon layer. The first elastic beams are formed in the epilayer and the top silicon layer, and the second elastic beams are formed in the epilayer.

Electrodes are provided on the mass and the comb coupling structure. The top cap and the bottom cap are made of silicon wafer or glass wafer.

A fabrication technique for a gyroscope includes the following steps:

(i) growing the epilayer on the surface of the top silicon layer of the silicon on insulator (SOI) silicon wafer;

(ii) forming, by use of thermal oxidation or chemical deposition, a silicon dioxide layer on the surface of the epilayer;

(iii) forming, by use of photolithography and etching, a plurality of holes with depth to the epilayer at the outer and inner portions of the surface of the silicon dioxide layer;

(iv) etching, by use of photolithography and deep etching, through the epilayer from the holes located at the outer portion of the silicon on insulator wafer, and deep etching the top silicon layer to a certain depth;

(v) removing the photoresist, and deep etching the holes located at the outer portion of the silicon on insulator wafer to the buried oxide layer in order to form the outer frame and the first elastic beams; meanwhile, at the inner portion, forming, by etching, a plurality of holes which have depth to the top silicon layer in order to form the second elastic beams;

(vi) removing the silicon dioxide layer;

(vii) forming a protection layer by depositing silicon nitride or silicon dioxide on the surface of the top silicon layer and the epilayer;

(viii) removing the protection layer in the horizontal direction, then bonding the silicon on insulator wafer with the top cap;

(ix) thinning and polishing the bottom silicon layer to a certain thickness; then growing or depositing a layer of silicon dioxide on the surface of the bottom silicon layer;

(x) removing, by use of photolithography and etching, the silicon dioxide layer located at the inner portion, thus exposing the inner portion of the bottom silicon layer;

(xi) etching, by use of chemical corrosion or deep etching, the inner portion of the bottom silicon layer to the buried oxide layer;

(xii) removing, by etching, the buried oxide layer located at the inner portion of the bottom silicon layer and the silicon dioxide layer located on the surface of the bottom silicon layer; then etching the exposed portion of the silicon on insulator wafer until the inner portion reaches the epilayer and the bottom silicon layer reaches the buried oxide layer, thus forming the inner frame and the mass;

(xiii) removing, by use of photolithography and etching, the buried oxide layer located on the surfaces of the inner frame, the first elastic beams, and the mass;

(xiv) removing the protection layer by etching; and (xv) performing a back-to-back silicon-silicon bonding to two silicon on insulator wafers, thus forming a complete MEMS anti-phase vibratory gyroscope.

The fabrication technique for the top cap and bottom cap also includes:

A. forming, by use of photolithography, deep etching and etching, a recess area on each bonding surface of the top cap and the bottom cap; and B. before the bonding step, cleaning the top cap and bottom cap.

The deep etching or etching method is performed using dry etching or wet etching, and dry etching includes silicon deep reactive ion etching or reactive ion etching.

The etchant for etching the silicon layer comprises one kind or a combination of the following etchants: potassium hydroxide, tetramethylammonium hydroxide, ethylenediamine pyrocatechol or gaseous xenon difluoride.

The etchant for etching the silicon dioxide layer comprises one or a combination of the following etchants: buffered hydrofluoric acid, 49% hydrofluoric acid or gaseous hydrogen fluoride.

According to the present invention, the gyroscope and its fabrication technique have the following advantages. First, there are two masses, thus a greater Coriolis force will be generated while detecting the angular velocity. The two masses design increases sensitivity of the present gyroscope. Compared with the prior art, which provides multiple masses in the horizontal direction, and connects the masses by elastic beams, the present invention provides two masses opposite to each other in the vertical direction, and thus reduces the chip area by at least half. Second, the present invention applies a voltage with opposite polarity to each mass, and uses electrical field coupling, which does not have any mechanical part, to drive the masses to vibrate. Thus, it is easier to achieve resonance in the present gyroscope, and measurement accuracy is improved. Furthermore, unlike the two-mass structure in the prior art, the present gyroscope does not require two sets of driving and detecting circuits. Therefore, the electrical circuit is simplified and the energy consumption is reduced. The overall structure of the gyroscope is simpler, and the manufacturing cost is lowered.

Additionally, since opposite charges attract each other, the two masses are moving vertically, but in the opposite direction to each other, which means the Coriolis force outputs produced by the two masses are anti-phase. If there is a linear acceleration along the detecting capacitor direction, the differential output circuit will eliminate the effect caused by the linear acceleration. Thus, it avoids the error in the detecting direction caused by the linear acceleration, and it also produces a Coriolis force with twice the magnitude. Therefore, the gyroscope according to the present invention has the advantages of high sensitivity and low error. Since the structure of the present invention is relatively simple, and the etching technique and bonding technique are relatively simple, the present fabrication technique also has a high productive efficiency and low manufacturing cost.

DETAILED DESCRIPTION

The present invention will be described in further detail below with reference to the drawings and specific embodiments.

Figure 1:
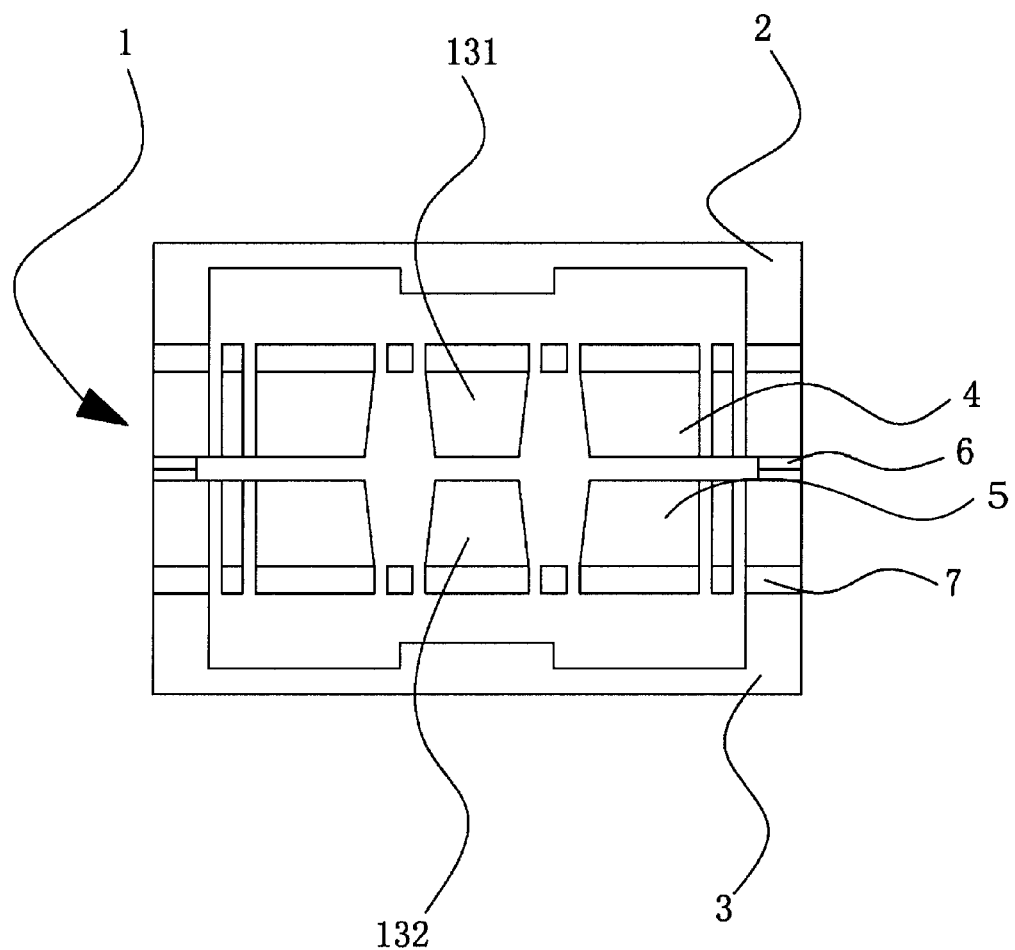
FIG. 1 is a plan view of a gyroscope structure.

With reference to FIG. 1, a gyroscope comprises a plurality of measurement masses 1, a top cap 2 and a bottom cap 3; both the top cap 2 and the bottom cap 3 are coupled with the measurement masses 1. The measurement mass 1 has a silicon-on-insulator structure, also known as SOI structure, which comprises a top silicon layer 4 and a bottom silicon layer 5. A buried oxide layer 6 is provided between the top silicon layer 4 and the bottom silicon layer 5.

Figure 2:
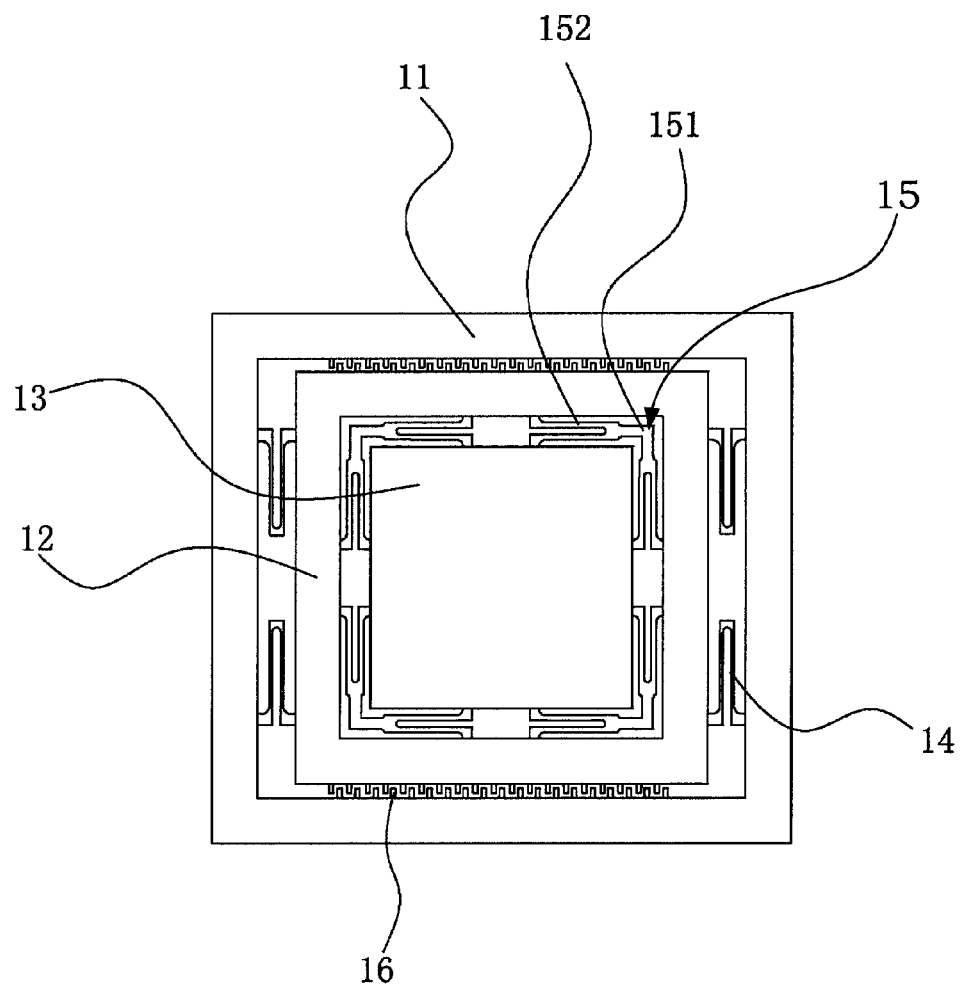
FIG. 2 is a top view of the measurement mass of the structure of FIG. 1.
Figure 3:
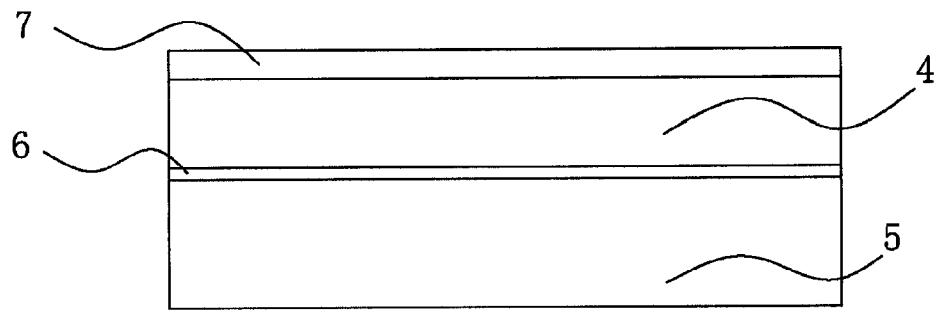
FIG. 3 illustrates step 1 of a fabrication technique for the structure of FIG. 1.
Figure 4:
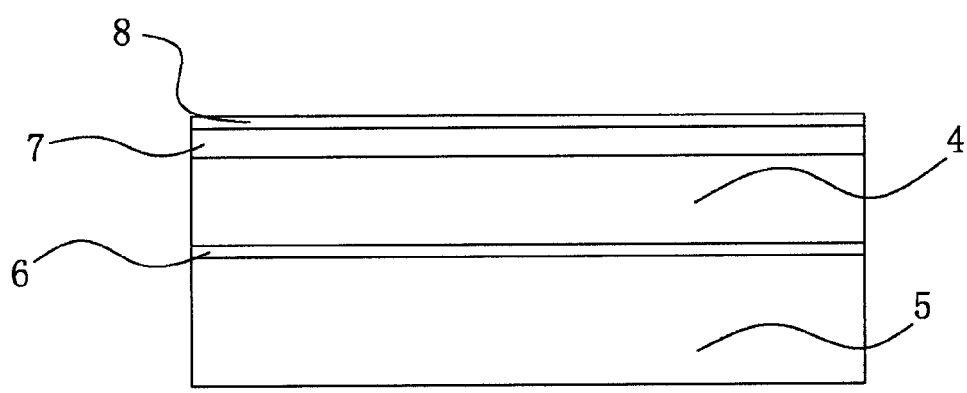
FIG. 4 illustrates step 2 of a fabrication technique for the structure of FIG. 1.
Figure 5:
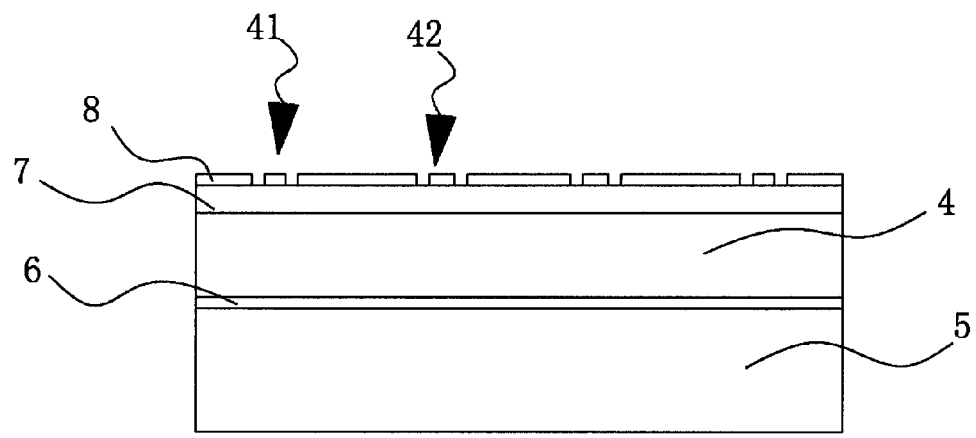
FIG. 5 illustrates step 3 of a fabrication technique for the structure of FIG. 1.
Figure 6:
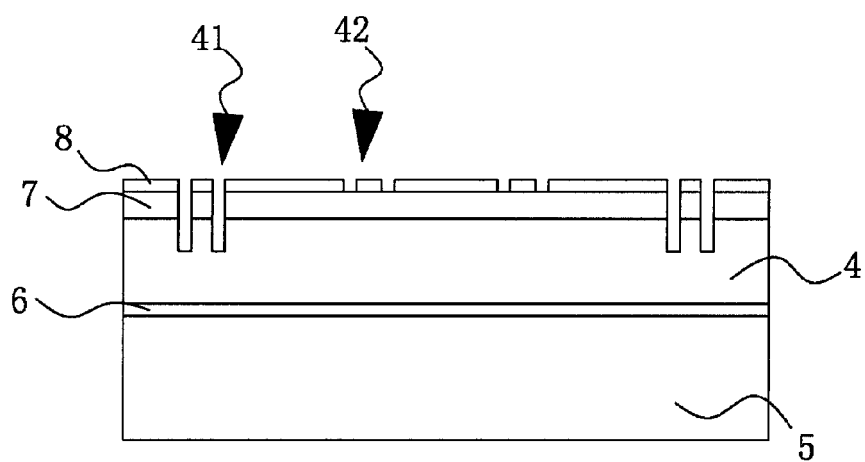
FIG. 6 illustrates step 4 of a fabrication technique for the structure of FIG. 1.
Figure 7:
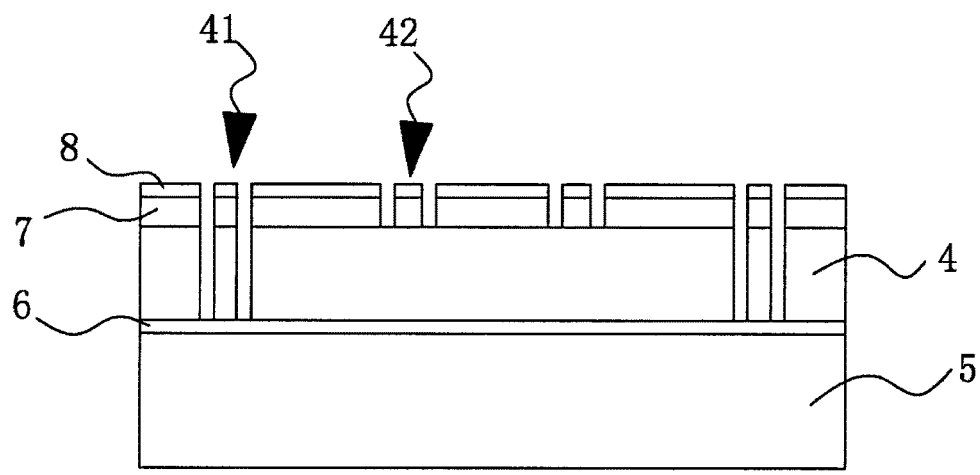
FIG. 7 illustrates step 5 of a fabrication technique for the structure of FIG. 1.
Figure 8:
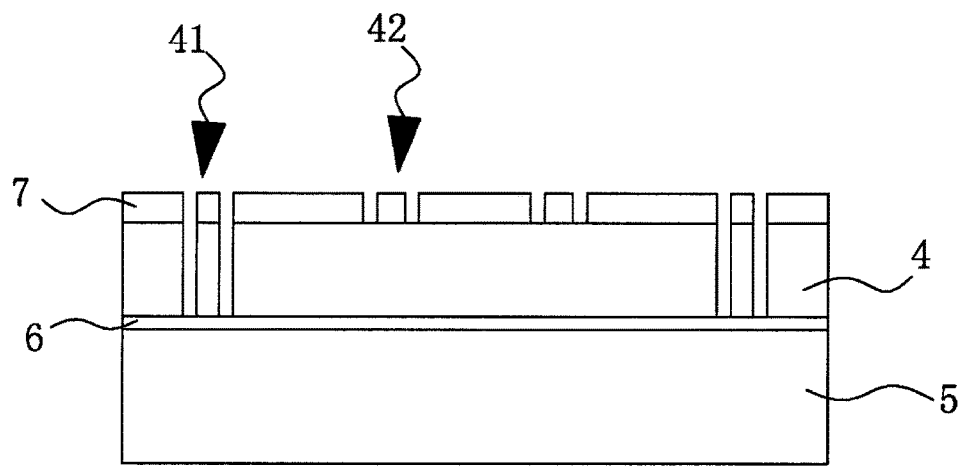
FIG. 8 illustrates step 6 of a fabrication technique for the structure of FIG. 1.
Figure 9:
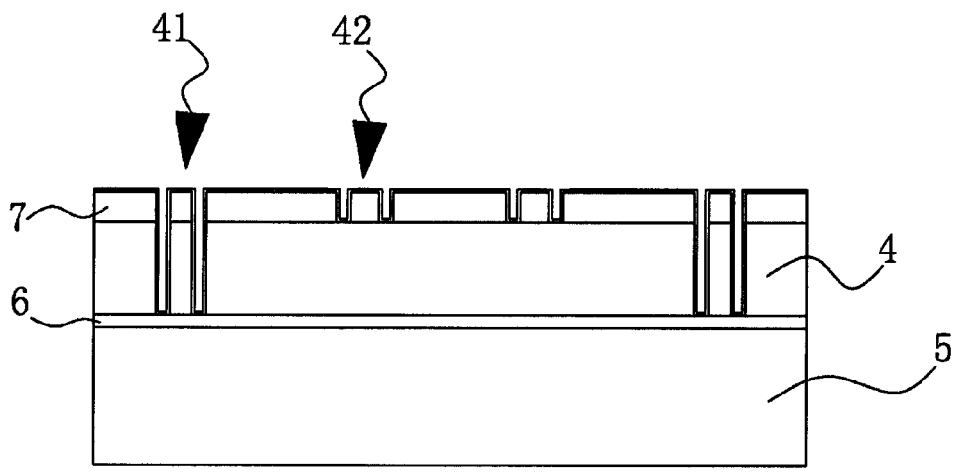
FIG. 9 illustrates step 7 of a fabrication technique for the structure of FIG. 1.
Figure 10:
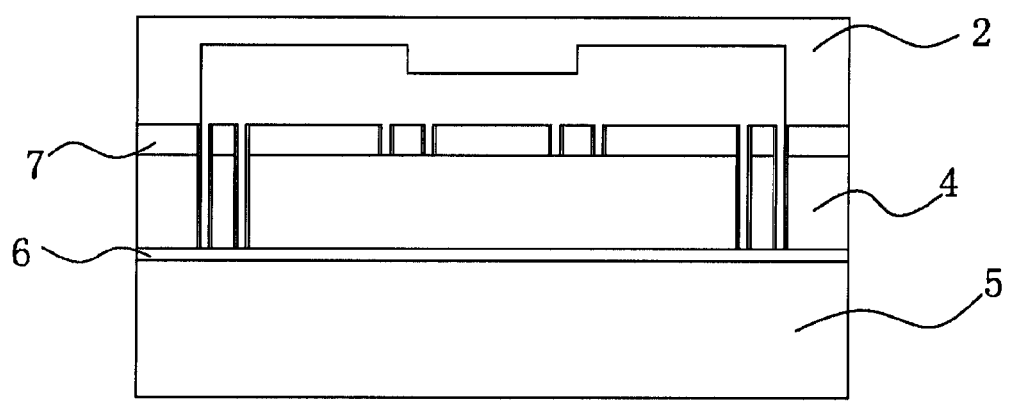
FIG. 10 illustrates step 8 of a fabrication technique for the structure of FIG. 1.
Figure 11:
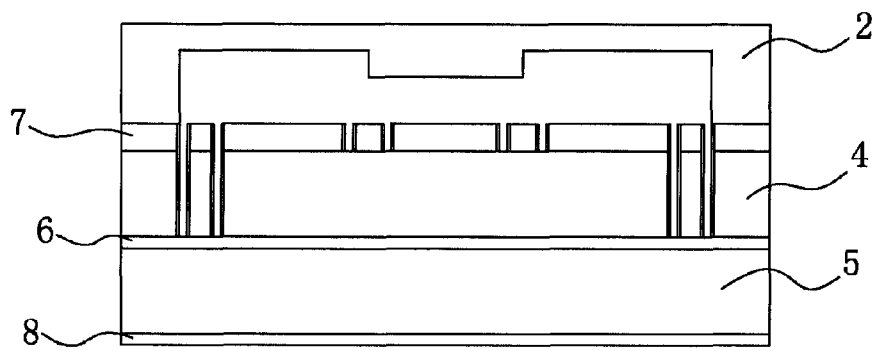
FIG. 11 illustrates step 9 of a fabrication technique for the structure of FIG. 1.
Figure 12:
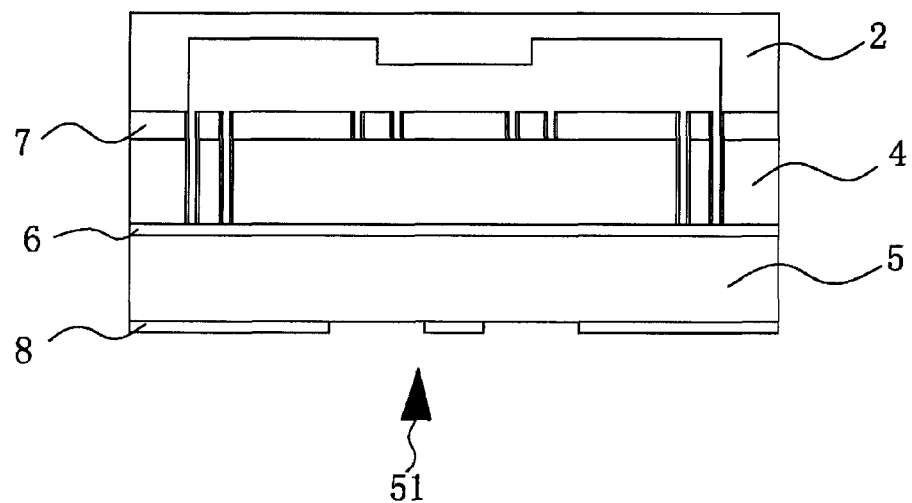
FIG. 12 illustrates step 10 of a fabrication technique for the structure of FIG. 1.
Figure 13:
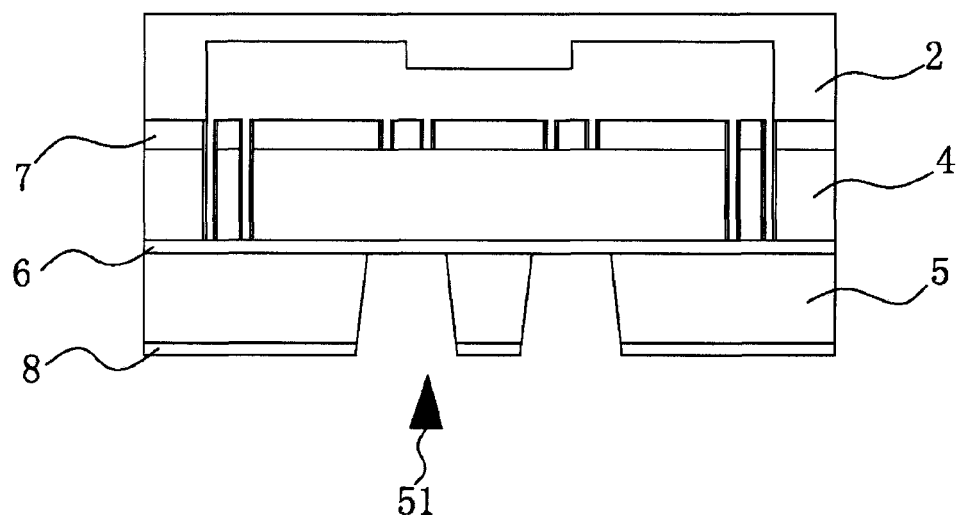
FIG. 13 illustrates step 11 of a fabrication technique for the structure of FIG. 1.
Figure 14:
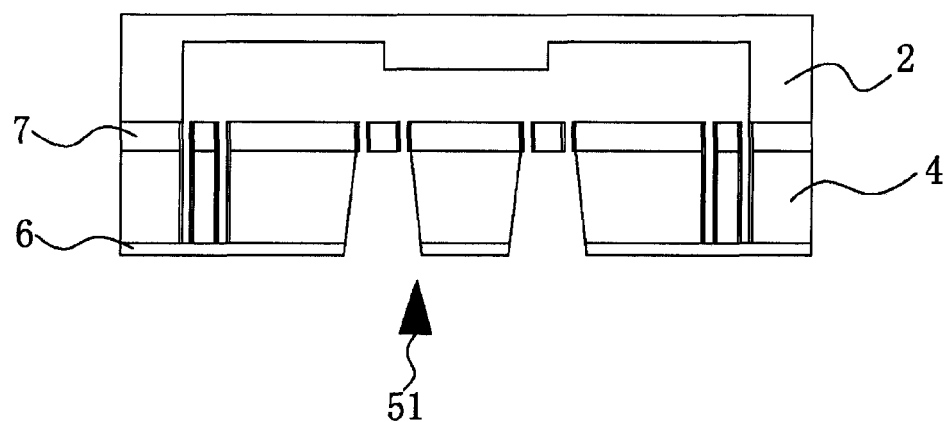
FIG. 14 illustrates step 12 of a fabrication technique for the structure of FIG. 1.
Figure 15:
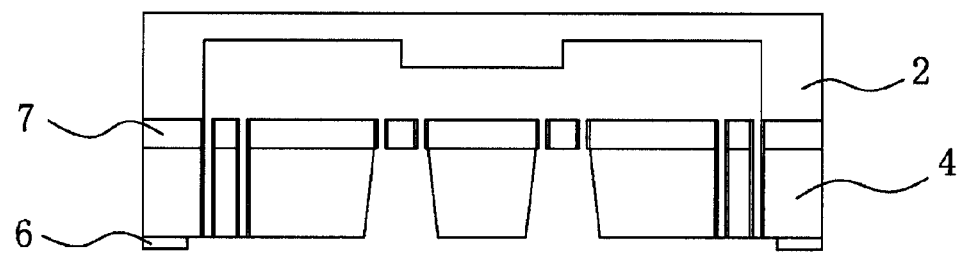
FIG. 15 illustrates step 13 of a fabrication technique for the structure of FIG. 1.
Figure 16:
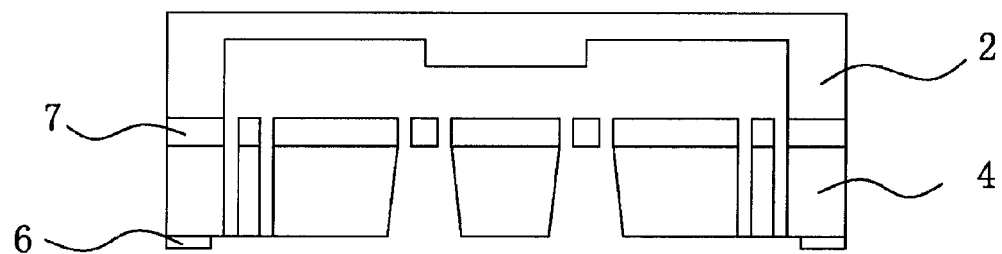
FIG. 16 illustrates step 14 of a fabrication technique for the structure of FIG. 1.
Figure 17:
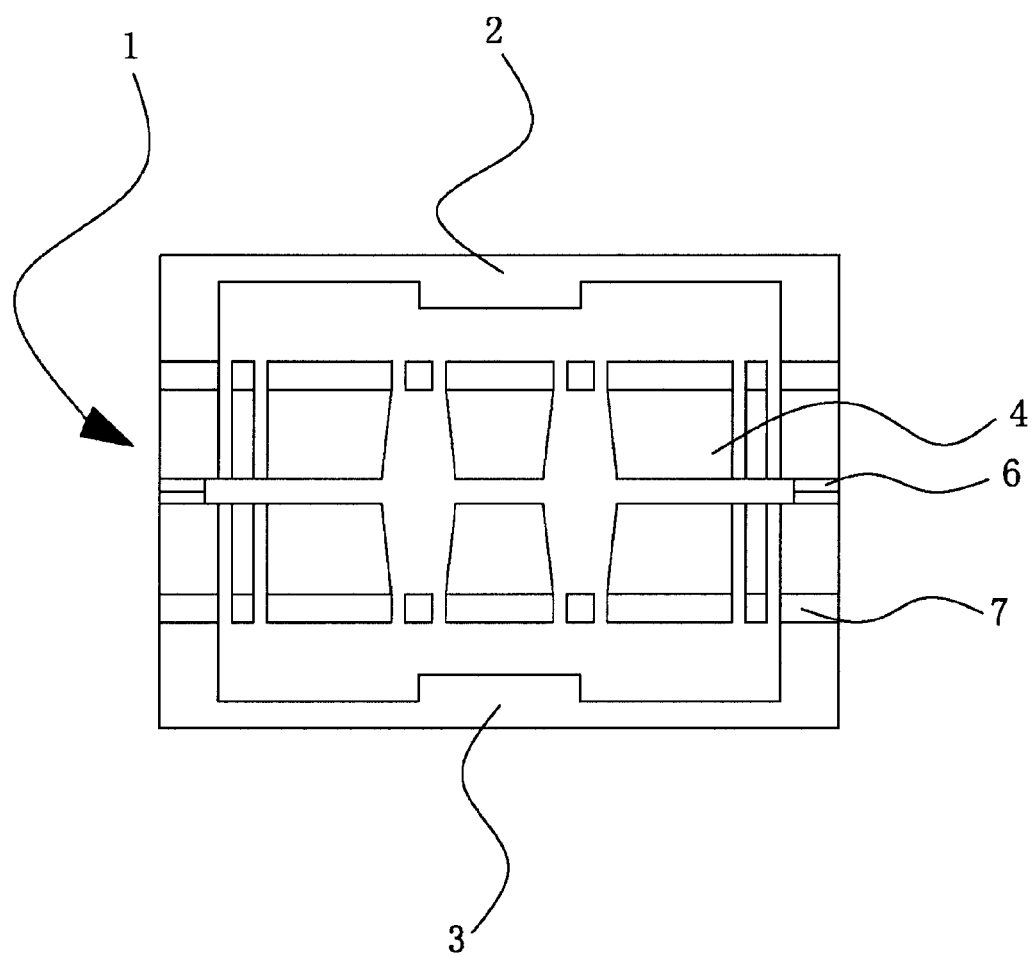
FIG. 17 illustrates step 15 of a fabrication technique for the structure of FIG. 1.

With reference to FIGS. 1 and 2, there are two measurement masses 1, which are coupled with each other in the vertical direction; each said measurement mass 1 comprises an outer frame 11, an inner frame 12, and a mass 13; the inner frame 12 is located within the outer frame 11, and the mass 13 is located within the inner frame 12; the two said measurement masses 1 are coupled with each other through the outer frame 11; the inner frame 12 is coupled with the outer frame 11 by a plurality of first elastic beams 14. Multiple groups of the first elastic beams 14 are provided in the gap space between the outer frame 11 and the inner frame 12; and the first elastic beams 14 can move freely within the gap space. The first elastic beams 14 are U-shape folded beams, and they are symmetrically provided with respect to the midline of the mass 13.

With reference to FIGS. 1 and 2, the mass 13 is coupled with the inner frame 12 by a plurality of second elastic beams 15. The second elastic beam 15 comprises two elastic beams with Y shape, each Y-shape elastic beam comprises one main body part 151 and two branch parts 152. Preferably, the mass 13 is a rectangular body. Two branch parts 152 are respectively coupled with the inner frame 12 and the mass 13. Each group of the second elastic beams 15 are symmetrically provided with respect to the midline of the mass 13. Two end portions of the main body parts 151 of the two Y-shape elastic beams are provided at each corner of the mass 13, and the two end portions are connected at a right angle. Furthermore, a comb coupling structure 16 is provided along the opposite sides of the outer frame 11 and the inner frame 12. When there is an angular velocity, the comb coupling structure 16 measures the displacement of the mass 13 and the inner frame 12 with respect to the outer frame 11.

With reference to FIGS. 1 and 2, after the gyroscope is packaged into chips, the integrated circuit will calculate the masses' 13 resonance frequency and the voltage for driving the masses 13 based on the mass of the masses 13. Then, it will respectively apply a voltage with opposite polarity to the two masses, for example, apply a positive voltage to the top mass 131 and apply a negative voltage to the bottom mass 132. Since two opposite charges attract to each other, after the voltages have been applied, the two masses 13 will move closer to each other and the second elastic beam 15 will deform. When the voltages disappear, the two masses 13 will return to their original state due to the resilience of the second elastic beams 15. If the integrated circuit periodically applies a voltage to the two masses 13, then the two masses 13 will vibrate accordingly; finally, they will achieve resonance frequency. As two masses 13 are vibrating along the vertical direction, i.e., the Z axis direction, then if there is an angular velocity on the Y axis, the two masses 13 will generate a Coriolis force along the X axis. The inner frame 12 and the masses 13 will be displaced along the X axis due to the Coriolis force. According to the equation $C=\epsilon A/d$, where the capacitance between two parallel conductive plates equals to the permittivity of material (c) times area (A) divide by the separation distance (d), the separation distance between the comb coupling structure 16 will change due to the displacement of the inner frame 12 and the masses 13 along the X axis. Thus the capacitance will also change. The integrated circuit can calculate the Coriolis force and further calculate the angular velocity by measuring the change in capacitance. Preferably, the first elastic beam 14 is relatively thick; thus it limits the vertical displacement of the inner frame 12. It also reduces the effect to the inner frame 12 of the noise and the error created while driving the masses 13 to vibrate in the vertical direction. On the other hand, the second elastic beam 15 is relatively thin, so that the masses 13 can be more easily displaced relative to the inner frame 12. The detection accuracy of the present gyroscope also increases.

With reference to FIGS. 1 and 2, while vibrating, the top mass 131 and the bottom mass 132 are moving in the opposite direction. When there is a linear acceleration, according to the right hand rule, two Coriolis forces with opposite directions will be generated respectively by the top mass 131 and the bottom mass 132. Since the inner frame 12 of each measurement mass 1 is relatively independent, the comb coupling structure 16 provided between the inner frame 12 and the outer frame 11 of each measurement mass 1 will respectively detect two Coriolis forces with equal magnitude but opposite direction. The integrated circuits can perform differential output to the two Coriolis forces in order to get a Coriolis force with twice the magnitude of the original Coriolis force. Thus, the measurement accuracy of the present gyroscope is further increased. On the other hand, since the two Coriolis forces generated by the two masses 13 have opposite directions, the linear acceleration along the detecting direction is canceled out, which lowers the gyroscope's measurement error.

Next, the fabrication technique for the gyroscope disclosed in the present invention is described with reference to FIGS. 3-17, which includes the following steps:

In step 1 (FIG. 3), the epilayer 7 is grown on the surface of the top silicon layer 4 of the SOI silicon wafer by thermal oxidation.

In step 2 (FIG. 4), a layer of silicon dioxide 8 is formed on the surface of the epilayer 7 of the SOI silicon wafer, for example, by thermal oxidation or chemical vapor deposition (CVD).

In step 3 (FIG. 5), a layer of photoresist is coated onto the top silicon layer 4 of the SOI silicon wafer, then exposed according to certain patterns, and developed with developers to reveal the patterns. The exposed parts of the silicon dioxide layer 8 are then etched to form multiple holes with depth to the epilayer 7 at the outer portion 41 and the inner portion 42 of the top silicon layer 4 by using dry reactive ion etching or buffered hydrofluoric acid.

In step 4 (FIG. 6), a layer of photoresist is coated onto the top silicon layer 4 of the SOI silicon wafer, then exposed according to certain patterns, and developed with developers to reveal the patterns. A deep reactive ion etching method is then used to etch through the epilayer 7 in the holes located at the outer portion 41. The top silicon layer 4 is then further etched to a certain depth.

In step 5 (FIG. 7), the photoresist coating is removed, then deep reactive ion etching is used to etch the holes located at the inner portion 42 to the top silicon layer 4 to form the second elastic beams 15. At the same time, the holes located at the outer portion 41 are etched to the buried oxide layer 6 to form the outer frame 11 and the first elastic beams 14.

In step 6 (FIG. 8), the silicon dioxide layer 8 is removed from the surface of the epilayer 7 by using buffered hydrofluoric acid or reactive ion dry etching method.

In step 7 (FIG. 9), a layer of silicon dioxide or silicon nitride is deposited on the surface of the SOI silicon wafer using CVD to form a protective layer.

In step 8 (FIG. 10), the protective layer in the horizontal direction is removed by reactive ion dry etching, then the SOI silicon wafer is bonded with the top cap 2.

In step 9 (FIG. 11), mechanical polishing is performed to the bottom silicon layer 5 of the SOI silicon wafer, and reduces its thickness. A layer of silicon dioxide 8 is then formed on the surface of the bottom silicon layer 5 by thermal oxidation or CVD method.

In step 10 (FIG. 12), a layer of photoresist is coated onto the bottom silicon layer 5 of the SOI silicon wafer, then exposed according to certain patterns, and developed with developers to reveal the patterns. The exposed parts of the silicon dioxide layer 8 located at the inner portion 51 of the bottom silicon layer 5 are then etched by using dry reactive ion etching or buffered hydrofluoric acid.

In step 11 (FIG. 13), the inner portion 51 of the bottom silicon layer 5 is etched to the buried oxide layer 6 by using deep reactive ion etching, potassium hydroxide, or tetramethylammonium hydroxide, or ethylenediamine pyrocatechol.

In step 12 (FIG. 14), the buried oxide layer 6 located at the inner portion 51 and the silicon dioxide layer 8 on the surface of the bottom silicon layer 5 is removed by using dry reactive ion etching or buffered hydrofluoric acid. The bottom silicon layer 5 is then etched until its inner portion 51 reaches to the epilayer 7, and the other parts are etched to the buried oxide layer 6 by using deep reactive ion etching, potassium hydroxide, tetramethylammonium hydroxide, or ethylenediamine pyrocatechol, thus forming the inner frame 12 and the mass 13.

In step 13 (FIG. 15), a layer of photoresist is coated onto the buried oxide layer 6 of the SOI silicon wafer, then exposed according to certain patterns, and developed with developers to reveal the patterns. The buried oxide layer 6 on the surfaces of the inner frame 12, the first elastic beams 14 and the mass 13 is then removed by using dry reactive ion etching or buffered hydrofluoric acid.

In step 14 (FIG. 16), with the photoresist coating still in place, remove the protective layer by using dry reactive ion etching or buffered hydrofluoric acid.

In step 15 (FIG. 17), the surfaces of the two SOI silicon wafers are cleaned, then a back-to-back silicon-silicon bonding to the two SOI silicon wafers is performed to form a complete MEMS anti-phase vibratory gyroscope.

The fabrication technique for the gyroscope disclosed in the present invention further includes the following steps for the top cap 2 and bottom cap 3:

Step A: Coat the top cap 2 and the bottom cap 3 with photoresist, then expose according to certain patterns, and develop with developers to reveal the patterns. Etch the exposed portions of the top cap 2 and the bottom cap 3 to a certain depth by using deep reactive ion etching method, potassium hydroxide, tetramethylammonium hydroxide, or ethylenediamine pyrocatechol, thereby forming a recess area on each bonding surface of the top cap 2 and the bottom cap 3. Remove the photoresist.

Step B: Before bonding with the SOI silicon wafer, clean the top cap 2 and the bottom cap 3.

The top cap 2 and the bottom cap 3 serve the purpose of protecting the measurement mass 1, and therefore can be made of silicon wafer or glass wafer.

The silicon dioxide layers 8 and silicon nitride layers 9 serve the purpose of protecting the covered-up silicon layers from etching or corrosion. The epilayer 7 is a monocrystalline silicon layer with relatively high dopant concentration, and serves the purpose of preventing the potassium hydroxide, tetramethylammonium hydroxide, or ethylenediamine pyrocatechol from further etching the silicon layer.

The etching or deep etching steps may be performed using dry etching or wet etching, and dry etching includes silicon deep reactive ion etching or reactive ion etching.

The material, equipment and techniques described above are generally known, but the gyroscope made by using these materials and techniques has the following advantages. First, the double mass design in the present invention makes the overall mass relatively large. Thus, during the measurement process, there will be a larger resonant displacement in both the driving direction and the measuring direction, and this improves the detection sensitivity. Second, compared with the prior art, which provides multiple masses in the horizontal direction, and connects the masses by using elastic beams, the two masses in the present invention are driven to vibrate by the same electrostatic force. This design saves the process of designing and fabricating the elastic beams for coupling the masses, which avoids the error caused by the fabrication process. It also reduces the coupling energy loss between the masses 13, and thus it is easier for the two masses to achieve optimum coupling. Furthermore, the electric circuit is simplified and the energy consumption is lowered. Third, the three dimensional structure reduces the chip area and increases the overall integration level of the gyroscope. Finally, the vibration mode of the two masses 13, which vibrate towards the opposite direction, dramatically increases the quality factor of vibration modes. It also effectively eliminates the error caused by the linear acceleration along the detection direction and the common mode error caused by a temperature increase. In the present invention, no electrodes are provided on the top cap 2 and the bottom cap 3. Thus, the material requirement is lower for the top cap 2 and the bottom cap 3. A person skilled in art is able to choose from a variety of materials to make the caps according to the cost and material property. Since the etching technique and silicon bonding technique are relatively simple, the present fabrication technique also has a high productive efficiency and low manufacturing cost. In conclusion, the present gyroscope has the advantages of high sensitivity, anti-interference and low noise.

The invention claimed is:

1. A MEMS anti-phase vibratory gyroscope, comprising:
   two measurement structures, each measurement structure including an outer frame, an inner frame located within the outer frame, and a mass located within the inner frame, wherein the two measurement structures are coupled with each other in the vertical direction through the outer frame, the inner frame is coupled with the outer frame by a plurality of first elastic beams, and the mass is coupled with the inner frame by a plurality of second elastic beams;
   a top cap and a bottom cap, each coupled with a respective one of the measurement structures; and
   a comb structure provided along opposite sides of the outer frame and the inner frame;
   wherein the two masses vibrate toward the opposite vertical direction, and the comb structure measures the angular velocity of rotation.

2. The gyroscope of claim 1, wherein the first elastic beams are provided between the inner frame and the outer frame and are symmetrically provided with respect to the midline of the mass.

3. The gyroscope of claim 1, wherein a gap space is formed between the inner frame and the outer frame, the first elastic beams are provided within the gap space, and the first elastic beams can move freely within the gap space.

4. The gyroscope of claim 1, wherein the first elastic beams are U-shape folded beams.

5. The gyroscope of claim 1, wherein the second elastic beams are provided between the mass and the inner frame, each second elastic beam comprises two elastic beams with a Y-shape, each Y-shape elastic beam includes one main body part and two branch parts, the two branch parts are respectively coupled with the inner frame and the mass.

6. The gyroscope of claim 5, wherein the main body parts of the two Y-shape elastic beams include end portions provided at the corner of the inner frame, and the two end portions are connected to each other at a right angle.

7. The gyroscope of claim 1, wherein the thickness of the first elastic beam is larger than the thickness of the second elastic beam.

8. The gyroscope of claim 1, wherein the measurement structure has a silicon on insulator structure which includes a top silicon layer and a bottom silicon layer, with a buried oxide layer provided between the two silicon layers, and an epilayer is formed on the surface of the top silicon layer.

9. The gyroscope of claim 8, wherein the first elastic beams are formed in the epilayer and the top silicon layer, and the second elastic beams are formed in the epilayer.

10. The gyroscope of claim 1, wherein electrodes are provided on the mass and the comb structure.

11. The gyroscope of claim 1, wherein the top cap and bottom cap are formed from a silicon wafer or a glass wafer.

12. A MEMS anti-phase vibratory gyroscope, comprising:
a top measurement structure and a bottom measurement structure, each measurement structure contained within a separate outer frame, each measurement structure having an inner frame, a mass, a plurality of first elastic beams and a plurality of second elastic beams, wherein each of the first elastic beams is coupled with the inner frame and the outer frame, and wherein each of the second elastic beams is coupled with the inner frame and the mass,
a top cap coupled with the top measurement mass;
a bottom cap coupled with the bottom measurement mass; and
a comb structure provided along opposite sides of the outer frame and the inner frame, wherein the masses vibrate toward the opposite vertical direction, and the comb structure measures the angular velocity of rotation.

* * * * *